US006475925B1

United States Patent
Braeckelmann et al.

(10) Patent No.: US 6,475,925 B1
(45) Date of Patent: Nov. 5, 2002

(54) REDUCED WATER ADSORPTION FOR INTERLAYER DIELECTRIC

(75) Inventors: Gregor W. Braeckelmann, Austin, TX (US); Stanley Michael Filipiak, Pflugerville, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/546,366

(22) Filed: Apr. 10, 2000

(51) Int. Cl.$^7$ .................. H01L 21/31; H01L 21/469
(52) U.S. Cl. .................. 438/763; 438/787; 438/788; 438/789
(58) Field of Search ................ 438/763, 787, 438/788, 789

(56) References Cited

U.S. PATENT DOCUMENTS 6,077,764 A * 6/2000 Sugiarto et al. ............ 438/597

OTHER PUBLICATIONS

Weise et al., "Characterization of fluorinated tetra ethyl ortho silicate oxide films deposited in a low pressure plasma enhanced chemical vapor deposition reactor," American Vacuum Society, pp. 1399–1402 (1977).

* cited by examiner

Primary Examiner—Alexander Ghyka
(74) Attorney, Agent, or Firm—Joseph R. Lally; Robert A. Rodriguez

(57) ABSTRACT

A method for forming a semiconductor device is disclosed in which a fluorinated silicon dioxide layer is formed over a semiconductor substrate. A first undoped silicon dioxide layer, with a thickness preferably less than approximately 50 nanometers, is then formed on the fluorinated silicon dioxide layer with a PECVD process wherein a power ratio of a high frequency power source of the PECVD reactor to a low frequency power source is preferably in a range of approximately 0.2:1 to 0.4:1. In one embodiment, a second undoped silicon dioxide layer may be formed prior to forming the fluorinated silicon layer. The second undoped silicon dioxide, the fluorinated silicon dioxide layer, and the first undoped silicon dioxide layer may be formed sequentially in the same plasma enhanced chemical vapor deposition process chamber during a single chamber evacuation cycle. The first undoped silicon dioxide layer is preferably characterized as having a refractive index greater than approximately 1.460. The first undoped silicon dioxide layer has a compressive stress that is approximately 1.5 times greater than the fluorinated silicon dioxide layer. In one embodiment, the first undoped silicon dioxide layer has a ratio of silicon atoms to oxygen atoms that is greater than 1:2. In one embodiment, the first undoped silicon dioxide layer and the fluorinated silicon dioxide layer are chemically vapor deposited using a TEOS precursor.

13 Claims, 3 Drawing Sheets

REDUCED WATER ADSORPTION FOR INTERLAYER DIELECTRIC

FIELD OF THE INVENTION

The present invention is related to the field of semiconductor fabrication and more particularly to a process of forming interlevel dielectric materials with reduced water adsorption to improve subsequent metalization processes.

BACKGROUND OF THE INVENTION

In the field of semiconductor fabrication, the desorption of water vapor from the wafer surface prior to metal deposition plays a key role in metal deposition processes. More particularly, water vapor from interlevel dielectric (ILD) layers can be incorporated into subsequently deposited films, such as tantalum (Ta), copper (Cu), aluminum (Al), and other metallic films, thereby altering their characteristics. If the desorption of water is significant, the resistivity of the subsequently deposited metal layer can be adversely affected through a water vapor initiated oxidation process. In addition, the desorption of water vapor from the ILD layer can result in undesirable particle formation during the deposition of a barrier layer in the metalization process.

In the field of semiconductor fabrication, it is becoming increasingly desirable to implement interlevel dielectric materials having a low dielectric constant (low k). For the purposes of this specification, a low dielectric constant material is a material having a dielectric constant less than that of silicon dioxide (k less than approximately 3.8). Low k dielectric materials reduce the coupling capacitance within a given metal layer and between adjacent metal layers, thereby increasing device speed. In one implementation, a low k dielectric material is achieved by incorporating fluorine into a dielectric material such as silicon dioxide ($SiO_2$). However, the fluorinated oxide films tend to adsorb water more readily than unfluorinated films. The adsorption of water in the fluorinated oxide film can negatively impact a subsequent metalization process by increasing the resistivity of the resulting metal and by producing contamination in the metalization chamber. Therefore, it would be desirable to implement an ILD process that produces a low k dielectric layer exhibiting low water vapor adsorption characteristics. It would be further desirable if the implemented process did not significantly increase the cost or complexity of the fabrication process and did not significantly alter the characteristics of the ILD material.

DETAILED DESCRIPTION OF THE DRAWINGS

The present invention contemplates a method and film suitable for use of a low k interlevel dielectric (ILD) fabrication process for forming a semiconductor device. The invention improves the metalization process by incorporating an interlevel dielectric with reduced water adsorption properties. The reduced water adsorption properties of the interlevel dielectric as contemplated herein beneficially improve subsequent metalization processing by reducing particle formation and improving the resistivity characteristics of the subsequently formed metal.

Figure 1:
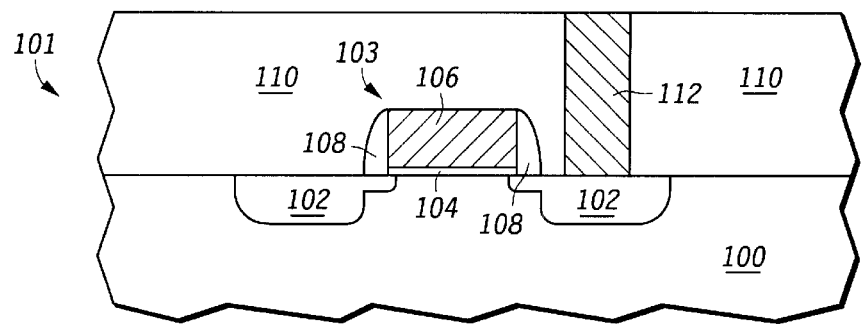
FIG. 1 is a partial cross-sectional view of a semiconductor substrate at an intermediate step in a fabrication process.

Turning now to the drawings, FIGS. 1–6 present a series of partial cross-sectional views at various stages in the fabrication of a semiconductor device 101 suitable for use in one embodiment of the invention. Referring to FIG. 1, a partially completed semiconductor device 101 is depicted. Semiconductor device 101 is formed on a wafer or substrate 100 typically comprised of a semiconductor material such as single crystal silicon as is well known in the field of semiconductor fabrication. In the embodiment depicted in FIG. 1, the semiconductor fabrication process is a metal oxide semiconductor (MOS) fabrication process. A MOS transistor 103 is shown as formed over substrate 100. Transistor 103 includes source/drain regions 102 laterally displaced on either side of a conductive gate structure 106. A gate oxide 104 is formed between conductive gate 106 and substrate 100. Transistor 103 as depicted in FIG. 1 further includes spacer structures 108 formed on sidewalls of conductive gate 106. A contact 112 typically comprised of a conductive material such as, for example, tungsten, is formed in a dielectric film 110 and is shown contacting source/drain region 102 of transistor 103. Transistor 103 may comprise either a PMOS transistor or an NMOS transistor. Typically, semiconductor device 101 includes multiple transistors 103 where some transistors 103 are NMOS transistors and others are PMOS transistors.

Figure 2:
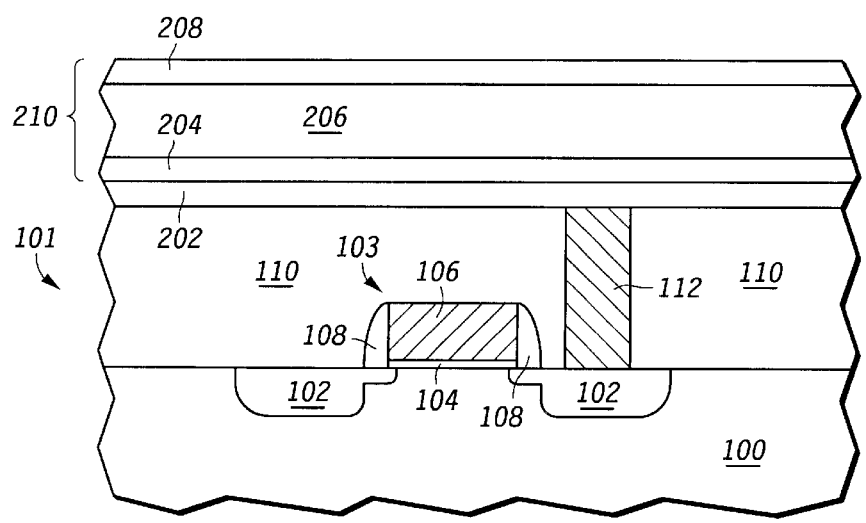
FIG. 2 is a processing step subsequent to FIG. 1 in which a first interlevel dielectric film is formed on the semiconductor substrate.

Turning now to FIG. 2, a first interlevel dielectric film 210 is formed over dielectric layer 110. The specific process depicted in FIGS. 2–6 illustrates an implementation of the present invention for use in a single inlaid metalization process. It should be noted however, that the invention is equally suitable for use in a dual inlaid metalization process as well as conventional metalization process.

In the depicted embodiment, an etch stop layer (ESL) 202 is formed over dielectric film 110 and contact 112. In the preferred embodiment, ESL 202 is comprised of a plasma enhanced nitride film as will be familiar to those knowledgeable in the field of semiconductor fabrication. Following the deposition of ESL 202, a first interlevel dielectric film 210 is deposited on ESL 202. In the depicted embodiment, first interlevel dielectric film 210 includes a base layer 204, a low k dielectric layer 206, and a capping layer 208. In one embodiment, base layer 204 and capping layer 208 are both undoped silicon dioxide films and low k dielectric layer 206 is a fluorinated silicon dioxide film. In one embodiment, base layer 204 and capping layer 208 are formed from a tetraethylorthosilicate (TEOS) source while low k dielectric layer 206 is formed from a fluorinated TEOS source.

In the preferred embodiment, capping layer 208 (also referred to herein as first undoped silicon dioxide layer), low k dielectric layer 206, and base layer 204 (also referred to herein as second undoped silicon dioxide layer) are deposited sequentially in a single PECVD process chamber during a single chamber evacuation cycle (i.e., deposited in situ). Base layer 204, as an example, may be formed by introducing a source gas such as TEOS into a plasma reactor chamber while maintaining substrate 100 at a temperature of approximately 400 degrees and a pressure of approximately 3.2 to 4.5 Torr. After a specified duration, a fluorine (or other suitable dopant) source gas, such as $SiF_4$ or the like may be then introduced into the reactor chamber to form the low k dielectric layer 206. After a specified duration, the source of fluorine (or other dopant) is shut off while the TEOS source continues to flow, thereby resulting in the formation of a second undoped film in the form of capping layer 208. In one embodiment, the silicon dioxide comprising capping layer 208 is silicon rich such that the ratio of silicon to oxygen is greater than 1:2.

In one embodiment, a thickness of base layer 204 is in the range of approximately 30–80 nanometers, a thickness of low k dielectric layer 206 is in the range of approximately 250–1200 nanometers and more preferably in the range of approximately 350–650 nanometers, while the thickness of capping layer 208 is less than approximately 50 nanometers and more preferably less than approximately 20 nanometers. By minimizing the thickness of capping layer 208 and base layer 204, the dielectric constant of first interlevel dielectric film 210 is dominated by the dielectric constant of low k dielectric layer 206 thereby resulting in a dielectric constant for film 210 that is approximately equal to the dielectric constant of low k dielectric layer 206.

In one embodiment, the formation of first interlevel dielectric film 210 is achieved in a dual frequency plasma enhanced chemical vapor deposition (PECVD) tool. Whereas a conventional TEOS film is typically formed using a high frequency power to low frequency power ratio of approximately 5:1 and a $TEOS;0_2$ flow rate of approximately 1:1, one embodiment of the first interlevel dielectric layer 210 is formed with the high frequency power source (operating at approximately 13.56 MHz) maintained between approximately 85 and 150 watts and the low frequency power source (with frequency of approximately 450 Hz) maintained between approximately 200 and 425 watts. More generally, the power ratio of the high frequency power source to the low frequency power source is preferably in the range of approximately 0.2:1 to 0.4:1. In one embodiment, the TEOS flow rate is maintained at 910 to 985 milligrams per minute while the oxygen flow rate is 565 to 645 sccm. In one embodiment helium is flowed at a flow rate of 700 to 1250 sccm through a first gas line that carries the TEOS source. A second gas line, separate from the first gas line, may further provide a second source of helium at a flow rate of 700 to 1350 sccm.

The refractive index (RI) of the undoped portions of the resulting film (i.e., base layer 204 and capping layer 208) is preferably greater than approximately 1.460 while the refractive index of the doped portion of the film (i.e., low k dielectric layer 206) has a nominal value of approximately 1.443. In addition, whereas the stress associated with a conventional TEOS film is approximately 100–150 megapascals (MPa) compressive, the stress of the undoped layers 204 and 208 is approximately 300 MPa compressive and the stress of the doped TEOS film 206 is approximately 180 MPa compressive. The dielectric constant of low k dielectric layer 206 is preferably in the range of approximately 3.4–3.7 while the dielectric constant of undoped films 204 and 208 is in the range of approximately 3.9–4.3. In the preferred embodiment, the overall dielectric constant of interlevel dielectric film 210 is in the range of approximately 3.6–3.8.

In one embodiment, the frequency of the high power source for the dual frequency PECVD tool is approximately 13.56 MHz while the frequency for the low frequency power source is approximately 470 kHz. The 5200 Centura DxZ deposition tool available from Applied Materials is a commercially available example of such a deposition tool.

Figure 3:
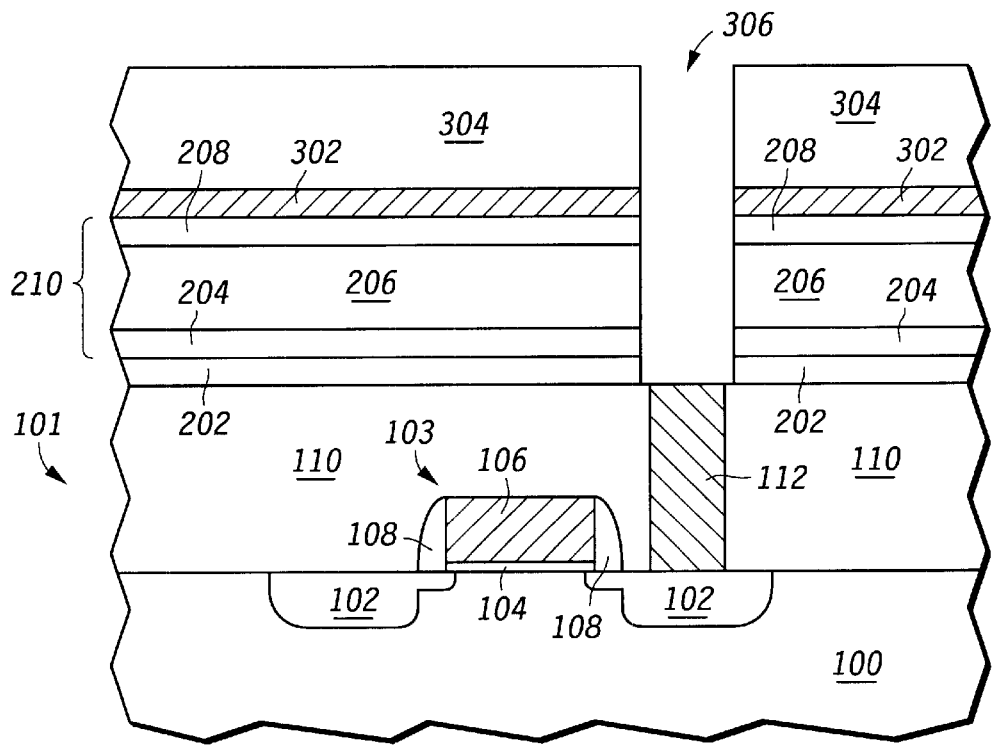
FIG. 3 is a processing step subsequent to FIG. 2 in which a via is patterned and etched into the first dielectric film.

Turning now to FIG. 3, a via 306 is etched into selected portions of first interlevel dielectric film 210 by first depositing and patterning a photoresist layer 304 using conventional photolithography processes. After photoresist 304 is patterned, via 306 is formed using a plasma etch process with a carbon-fluorine source gas. The formation of via 306 is accomplished in one embodiment with a plasma etch using a fluorine-oxide plasma that removes interlevel dielectric layer 210. Following the removal of the desired portions of interlevel dielectric layer 210, the etch chemistry is modified to remove the underlying etch stop layer 202 to clear the bottom of via 306.

In the embodiment depicted in FIG. 3, an anti-reflective coating (ARC) 302 is formed over first interlevel dielectric layer 210 prior to depositing photoresist layer 304. Antireflective coating 302, as is well known in the field of photolithography and etch, improves the critical dimension control of the desired feature. Materials suitable for use as antireflective coating 302 include silicon rich silicon oxynitride, and suitable organic materials.

Figure 4:
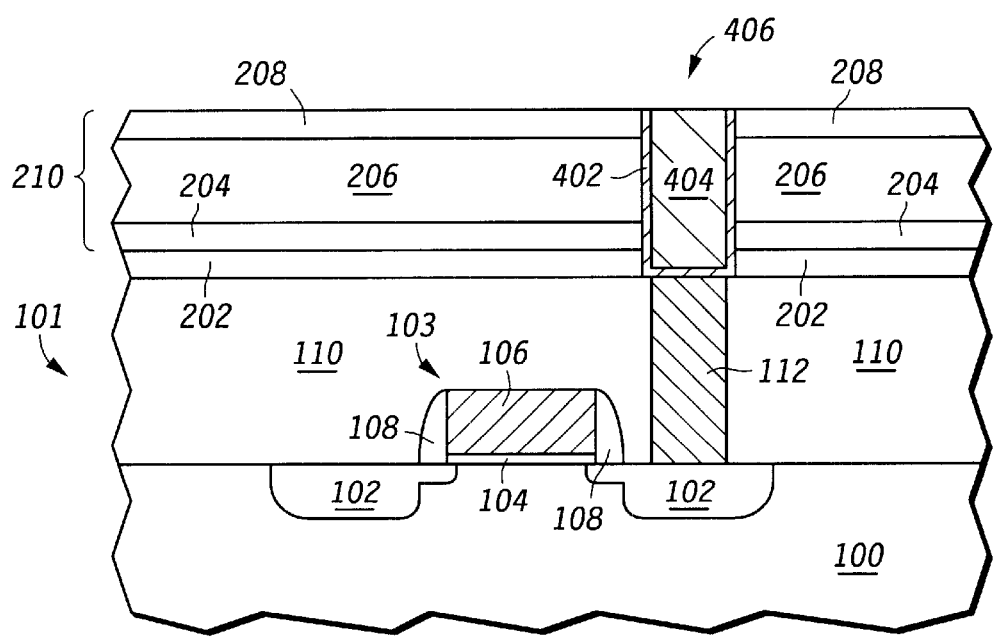
FIG. 4 is a processing step subsequent to FIG. 3 in which the via is filled with a conductive material.

Turning now to FIG. 4, the via 306 of FIG. 3 is filled with a conductive material to form an electrical connection to contact 112 and source/drain region 102. Following the formation of via 306 as depicted in FIG. 3, photoresist 304 is removed with a conventional resist strip process. Subsequently, the depicted embodiment of the process includes the deposition of a barrier material 402 to cover the sidewalls of void 306. Suitable barrier materials include, as examples, titanium, tantalum, tungsten and their nitrides. Following the deposition of barrier material 402, the remainder of via 306 is filled with a metal 404. Suitable metals for use as metal 404 include copper, aluminum, silicon, and alloys thereof. Following the deposition of barrier layer 402 and metal 404, portions of the deposited materials exterior to via 306 are removed with a chemical mechanical polish (CMP) process to produce a contact 406 with a substantially planar upper surface of semiconductor device 101. The CMP process may remove portions of capping layer 208 such that the capping layer 208 depicted in FIG. 4 may have a thickness that is less than the thickness of capping layer 208 depicted in FIG. 3. As depicted in FIG. 4, the preferred embodiment of the CMP process removes all of the anti-reflective coating layer 302 formed over capping layer 208.

Figure 5:
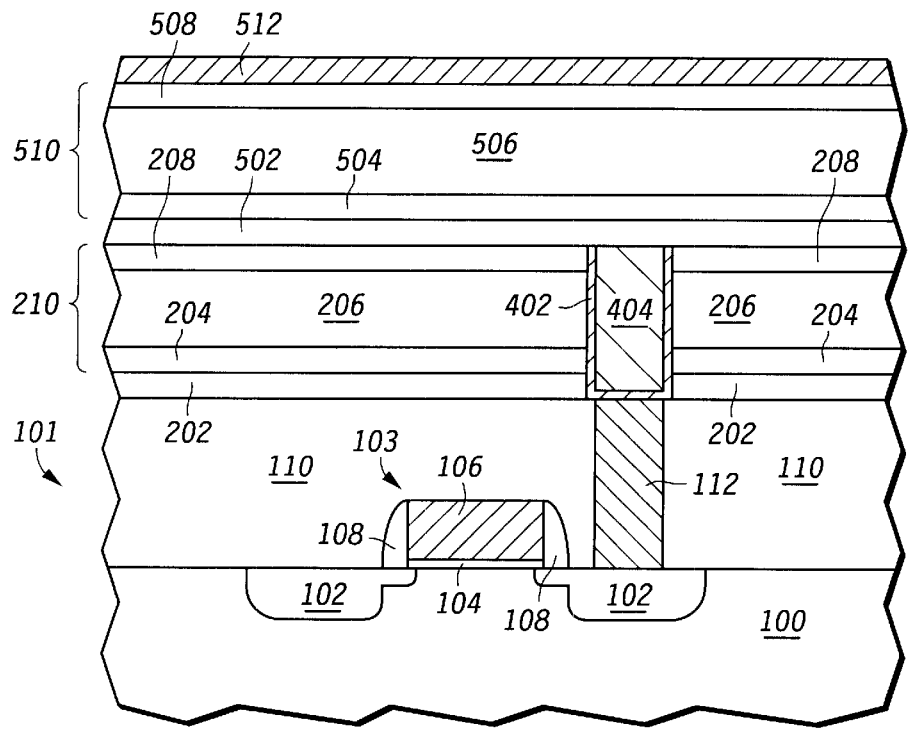
FIG. 5 is a processing step subsequent to FIG. 4 in which a second interdielectric film is formed on the substrate.

Turning now to FIG. 5, further processing of semiconductor device 101 is depicted. In this embodiment, a second interlevel dielectric film 510 is formed over first interlevel dielectric film 210. In the depicted embodiment, a second etch stop layer 502 is blanket deposited prior to formation of second interlevel dielectric film 510. In one embodiment, second ESL 502 is formed in the same manner as the formation of first ESL 202. Similarly, one embodiment of the invention utilizes a second interlevel dielectric film 510 that is substantially the same as first interlevel dielectric film 210. Accordingly, one embodiment of second interlevel dielectric film 510 includes an undoped second base layer 504 formed over second ESL 502, a second low k dielectric layer 506 formed over second base layer 504, and a second capping layer 508 formed over second low k dielectric layer 506. In one embodiment, the recipe used for the formation of second interlevel dielectric 510 is substantially similar to the recipe used for the formation of first interlevel dielectric film 210. In another embodiment, the duration of the process that forms second low k dielectric layer 506 is reduced or increased to result in an appropriately thinner or thicker dielectric film. Following the formation of second interlevel dielectric film 510, a second anti-reflective coating layer 512 is formed on an upper surface of the wafer to facilitate a subsequent photolithography and etch process.

Figure 6:
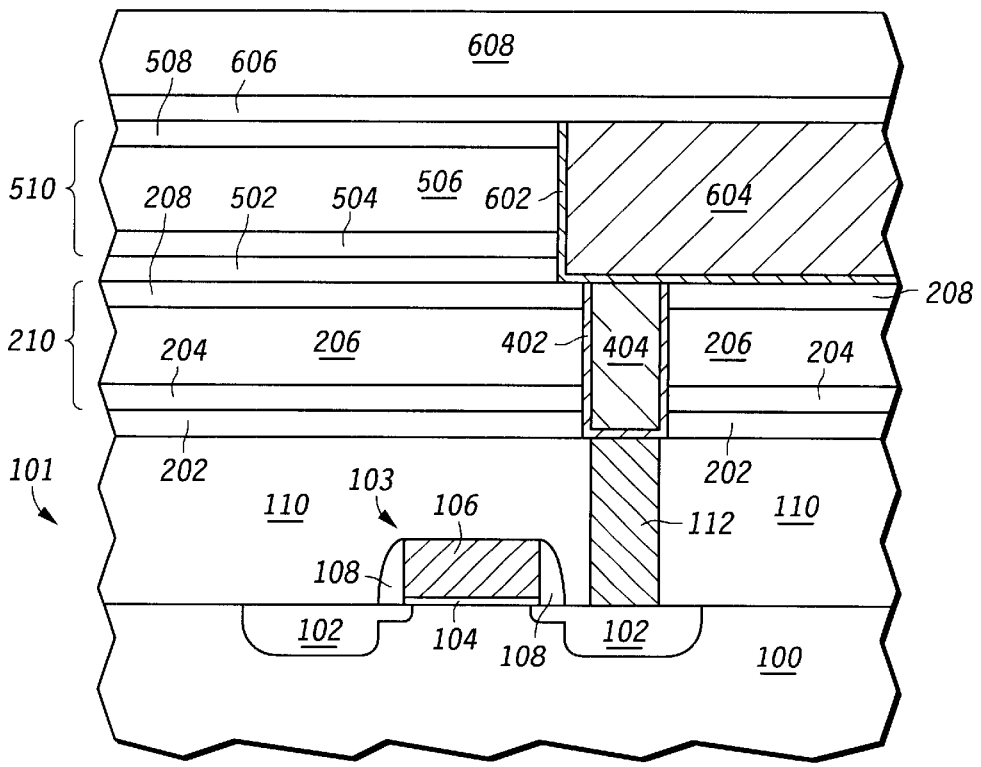
FIG. 6 is a processing step subsequent to FIG. 5 in which a trench is formed and filled with a conductive material and the entire substrate is then covered with a passivation material.

Turning now to FIG. 6, following the formation of second interlevel dielectric film 510, a trench is formed in second interlevel dielectric film 510 and filled with a metal 604 to form an interconnect that contacts the underlying via 404. The formation of the trench is accomplished by patterning a photoresist layer and performing an etch of the exposed portions of the underlying second interlevel dielectric layer 510 in a manner substantially the same as the process used to form via 306 in first interlevel dielectric layer 310. Following the formation of the trench, a barrier layer 602 is deposited on the sidewalls and floor of the trench in the same manner as the formation of first barrier layer 402 on the sidewalls of via 306. Suitable material for second barrier layer 602 include refractory metals such as, for example, titanium, tantalum, tungsten, and their nitrides. Following the deposition of second barrier layer 602, a second metal layer 604 is deposited. The second metal 604 may comprise copper, aluminum, silicon, or a suitable alloy thereof. In one embodiment, the deposition of second metal 604 is followed by a chemical mechanical polish process to remove portions of second metal 604 and second barrier layer 602 from regions exterior to the trench formed in second interlevel dielectric layer 510.

Following the chemical mechanical polish process, semiconductor device 101 is passivated. In the depicted embodiment, the passivation of semiconductor device 101 includes a first passivation layer 606 comprised of a material such as plasma enhanced nitride that seals the copper or other metal in second metal layer 604 from subsequent passivation layers. Following the deposition of first passivation layer 606, a second passivation layer 608 typically comprised of silicon oxynitride or other suitable passivation material, is deposited over first passivation layer 606. Those knowledgeable in the field of semiconductor fabrication will appreciate that while the embodiment of the process described with respect to FIGS. 2–6 indicates a single metal layer 604 and a single via layer 402, other embodiments may implement multiple via and metal layers by essentially repeating the process used to form first interlevel dielectric layer 210 and second interlevel dielectric layer 510 to produce a semiconductor with multiple interconnect layers.

The incorporation of capping layer 508 and 208 over the corresponding low k dielectric layers 206 and 506 improves the subsequent metalization processes by reducing the desorption of water vapor from semiconductor device 101 during the metalization process. By preventing the low k dielectrics 206 and 506 from being exposed to ambient conditions, capping layers 208 and 508 substantially reduce the amount of water adsorbed in the corresponding interlevel dielectric levels. The reduction in adsorbed water reduces water vapor particulization during subsequent deposition of barrier layers 402 and 602 thereby decreasing the defectivity of the barrier layer deposition processes. In addition, the uniformity of the resulting sheet resistance of the metal layers is improved by reducing the oxidation effects of the metal. Fourier transform infrared (FT-IR) spectrophotometry of semiconductor wafers fabricated with and without capping layers 508 and 208 reveal that the use of low k dielectric material in the form of fluorinated TEOS films without a capping layer results in increased O—H bonds and decreased silicon oxide bonds. More specifically, inspection of the resulting FT-IR spectral plots indicates increased IR absorbance over a broad band of wave numbers from approximately 3000–3800. This increased absorbance is direct evidence of increased water or O—H bonds in the film. In addition, the FT-IR spectral plots taken over time indicate decreased absorbance at wave numbers of approximately 1000 to 1250 cm$^{-1}$ for Si—O, 920 to 955 cm$^{-1}$ for Si—F and 790 to 850 for Si—O, thereby indicating that the Si, F, and O bonds have undergone rearrangement. This is also typical of the film adsorbing water. This can be further substantiated by comparing the partial pressure of water desorbing at 400° C. from first undoped silicon dioxide layer with the partial pressure of water desorbing from a fluorinated silicon dioxide film exposed to air (i.e., an uncapped fluorinated oxide) using mass-spectrometer analysis. The partial pressure of water desorbing from the undoped silicon dioxide capping layer is approximately an order of magnitude lower than the partial pressure of water desorbing from the uncapped fluorinated oxide film.

A further advantage of the silicon dioxide capping layer is its etch characteristics. The silicon dioxide capping layer has a higher etch selectivity than fluorinated silicon dioxide. Therefore, the base layers 204 and 504 can act as a highly selective etch stop layer thereby making it possible to thin the etch stop layers 202 and 502 to further reduce the dielectric constant of the stack. The etch selectivity of undoped silicon dioxide is approximately 15% higher than fluorinated silicon dioxide using conventional carbon fluorine containing etch chemistries. Greater selectivity between doped and undoped silicon dioxide is achievable with optimized etch chemistries.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be considered as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for forming a semiconductor device comprising:
   forming a substantially planar fluorinated silicon dioxide layer over a semiconductor substrate;
   forming a first undoped silicon dioxide layer on the fluorinated silicon dioxide layer, wherein:
      the first undoped silicon dioxide layer has a thickness less than approximately 50 nanometers; and
      the first undoped silicon dioxide layer is formed using a plasma enhanced chemical vapor deposition process, wherein a process pressure during the plasma enhanced chemical vapor deposition process is in a range of approximately 3.2–4.5 Torr and a power ratio of a first power having a frequency of approximately 13.56 megahertz to a second power having a frequency of approximately 450 hertz is in a range of approximately 0.2:1 to 0.4:1; and
   forming a metal layer on the first undoped silicon dioxide capping layer.

2. The method of claim 1, further comprising flowing a tetraethyloxthosilicate source at a first flow rate in a range of approximately 910–985 milligram per minute and flowing an oxygen source gas at a second flow rate in a range of approximately 565–645 standard cubic centimeters per minute.

3. The method of claim 2, further comprising flowing a helium carrier gas at a third flow rate in a range of approximately 700–1250 standard cubic centimeters per minute through a first gas line that accompanies the tetraethylorthosilicate source and flowing a helium source gas at a fourth flow rate in a range of approximately 700–1350 standard cubic centimeters per minute through a second gas line, wherein the first gas line and the second gas line are separate gas lines.

4. The method of claim 1, further comprising forming a second undoped silicon dioxide layer, wherein the fluorinated silicon dioxide layer is formed on the second undoped silicon dioxide layer.

5. The method of claim 4, wherein the second undoped silicon dioxide, the fluorinated silicon dioxide layer and the first undoped silicon dioxide layer are sequentially formed in a same plasma enhanced chemical vapor deposition process chamber during a single chamber evacuation cycle.

6. The method of claim 1, wherein a thickness of the second undoped silicon dioxide layer is in a range of approximately 30–80 nanometers.

7. The method of claim 1, wherein the first undoped silicon dioxide layer is further characterized as having a refractive index greater than approximately 1.460.

8. The method of claim 1, wherein the first undoped silicon dioxide layer has a compressive stress that is approximately 1.5 times greater than the fluorinated silicon dioxide layer.

9. The method of claim 1, wherein the first undoped silicon dioxide layer has a ratio of silicon atoms to oxygen atoms that is greater than 1:2.

10. The method of claim 1, wherein the first undoped silicon dioxide layer has moisture adsorption properties that can further be characterized by a substantial absence of O—H bonds in FT-IR spectral plots of the layer.

11. A method for forming a semiconductor device comprising:
   forming a substantially planar fluorinated silicon dioxide layer over a semiconductor substrate;
   forming a first undoped silicon dioxide layer on the fluorinated silicon dioxide layer, wherein the first undoped silicon dioxide layer has a thickness less than approximately 50 nanometers, and wherein:
      the first undoped silicon dioxide layer is formed using a plasma enhanced chemical vapor deposition process, wherein a process pressure during the plasma enhanced chemical vapor deposition process is in a range of approximately 3.2–4.5 Torr and a power ratio of a first power having a frequency of approximately 13.56 megahertz to a second power having a frequency of approximately 450 hertz is in a range of approximately 0.2:1 to 0.4:1.

12. The method of claim 11, further comprising flowing a tetraethylorthosilicate source at a first flow rate in a range of approximately 910–985 milligrams per minute and flowing an oxygen source gas at a second flow rate in a range of approximately 565–645 standard cubic centimeters per minute.

13. The method of claim 12, further comprising flowing a helium carrier gas at a third flow rate in a range of approximately 700–1250 standard cubic centimeters per minute through a first gas line that accompanies the tetraethylorthosilicate source and flowing a helium source gas at a fourth flow rate in a range of approximately 700–1350 standard cubic centimeters per minute through a second gas line, wherein the first gas line and the second gas line are separate gas lines.

* * * * *

UNITED STATES PATENT AND TRADEMARK OFFICE
CERTIFICATE OF CORRECTION

PATENT NO. : 6,475,925 B1 Page 1 of 1
DATED : November 5, 2002
INVENTOR(S) : Braeckelmann et al.

It is certified that error appears in the above-identified patent and that said Letters Patent is hereby corrected as shown below:

<u>Column 6,</u>
Line 67, change "tetraethyloxthosilicate" to -- tetraethylorthosilicate --

Signed and Sealed this

Tenth Day of June, 2003

JAMES E. ROGAN
*Director of the United States Patent and Trademark Office*